(12) United States Patent
Nakano

(10) Patent No.: US 10,966,322 B2
(45) Date of Patent: Mar. 30, 2021

(54) SEMICONDUCTOR DEVICE AND MANUFACTURING METHOD OF SEMICONDUCTOR DEVICE

(71) Applicant: Fuji Electric Co., Ltd., Kanagawa (JP)

(72) Inventor: Hayato Nakano, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/241,099

(22) Filed: Jan. 7, 2019

(65) Prior Publication Data

US 2019/0254167 A1 Aug. 15, 2019

(30) Foreign Application Priority Data

Feb. 14, 2018 (JP) .............................. JP2018-024562

(51) Int. Cl.
| | |
|---|---|
| *H05K 1/18* | (2006.01) |
| *H01L 23/495* | (2006.01) |
| *H01L 21/56* | (2006.01) |
| *H01L 23/48* | (2006.01) |
| *H01L 29/78* | (2006.01) |
| *H01L 29/739* | (2006.01) |
| *H01L 29/423* | (2006.01) |
| *H01L 29/06* | (2006.01) |
| *H01L 23/498* | (2006.01) |
| *H05K 3/34* | (2006.01) |

(Continued)

(52) U.S. Cl.
CPC ........... *H05K 1/181* (2013.01); *H01L 21/565* (2013.01); *H01L 23/481* (2013.01); *H01L 23/49531* (2013.01); *H01L 23/49562* (2013.01); *H01L 23/49811* (2013.01); *H01L 29/0657* (2013.01); *H01L 29/0696* (2013.01); *H01L 29/42376* (2013.01); *H01L 29/7395* (2013.01); *H01L 29/7802* (2013.01); *H05K 3/3447* (2013.01); *H01L 29/1608* (2013.01); *H01L 29/2003* (2013.01); *H01L 29/7393* (2013.01); *H05K 2201/1031* (2013.01)

(58) Field of Classification Search
CPC ........ H01L 23/49531; H01L 23/49811; H05K 3/3447
See application file for complete search history.

(56) References Cited

U.S. PATENT DOCUMENTS

| | | | | |
|---|---|---|---|---|
| 6,896,526 B2* | 5/2005 | Pitzele | ................. | H05K 3/3447 174/266 |
| 2009/0194869 A1* | 8/2009 | Eom | ..................... | H01L 23/367 257/712 |

(Continued)

FOREIGN PATENT DOCUMENTS

| | | |
|---|---|---|
| JP | 5101592 B2 | 12/2012 |
| WO | 2014/061211 A1 | 4/2014 |

*Primary Examiner* — Farun Lu
(74) *Attorney, Agent, or Firm* — Chen Yoshimura LLP

(57) ABSTRACT

A semiconductor device includes: a sealed unit that seals a semiconductor element therein; a connection terminal that is electrically connected to the semiconductor element and is provided so as to project outward from the sealed unit; and a pedestal that is provided to surround a bottom part of an exposed portion of the connection terminal that is exposed from the sealed unit. The pedestal has a base attached to the sealed unit and a guide part that has an inclined side face.

20 Claims, 12 Drawing Sheets

(51) Int. Cl.
*H01L 29/16* (2006.01)
*H01L 29/20* (2006.01)

(56) References Cited

U.S. PATENT DOCUMENTS

2013/0050954 A1* 2/2013 Albrecht, III ...... H05K 7/20454
  361/720
2015/0223339 A1 8/2015 Nakamura et al.

* cited by examiner

|  | Working Example 1 | Working Example 2 | Working Example 3 |
|---|---|---|---|
| Height a | 0.7 | 0.5 | 0.3 |
| Height b | 2.2 | 2.3 | 1.4 |
| a+b | 2.9 | 2.8 | 1.7 |

FIG. 6

SEMICONDUCTOR DEVICE AND MANUFACTURING METHOD OF SEMICONDUCTOR DEVICE

BACKGROUND OF THE INVENTION

Technical Field

The present invention relates to a semiconductor device and a manufacturing method of a semiconductor device.

Background Art

In recent years, power semiconductor modules, particularly IGBT (insulated-gate bipolar transistors), have become widely used in power conversion devices. Power semiconductor modules are power semiconductor devices in which one or a plurality of power semiconductor chips are built therein, thereby forming a portion or the entirety of a conversion connection.

Power semiconductor modules are trending toward becoming thinner, smaller, and able to handle a larger volume of current. Therefore, mold-type power semiconductor modules that do not have a terminal case, metal substrate, or lid are being studied. In mold-type power semiconductor modules, a multilayer substrate that includes a power semiconductor chip is molded inside a mold using a sealing resin.

FIG. 7 is a side view that shows a conventional power semiconductor module. In the conventional power semiconductor module, a multilayer substrate on which a power semiconductor chip has been mounted is sealed inside a sealed unit 101. Connection terminals 103 are fixed via soldering or the like on the multilayer substrate, and these terminals pass through the sealed unit 101 and protrude to the exterior of the sealed unit 101.

FIG. 8 is an enlarged side view of a connection terminal of a conventional power semiconductor module. The connection terminal 103 protrudes upward from a cylindrical pedestal 102 that has a flat section 106 in order to support a wiring board (not shown). A semiconductor device that, by providing the pedestal 102 that has the flat section 106 in such a manner, makes it possible to horizontally connect a wiring board is well-known (see Patent Document 1, for example).

RELATED ART DOCUMENT

Patent Document

Patent Document 1: WO 2014/061211

SUMMARY OF THE INVENTION

Here, FIG. 9 is an enlarged side view of the vicinity of a connection terminal when the conventional power semiconductor module has been connected to a wiring board. As in FIG. 9, the connection terminal 103 is inserted into a through-hole 107 formed in a wiring board 104, and the wiring board 104 is supported by the flat section 106 of the pedestal 102. The connection terminal 103 is electrically connected to the through-hole 107 via soldering, for example.

However, there are cases in which the formation location of the connection terminal 103 or the formation location of the through-hole 107 shifts. As a result, as shown by a region A in FIG. 9, there are cases in which there is no longer any clearance (gap) between the connection terminal 103 and the through-hole 107. In such a case, there is not enough solder between the connection terminal 103 and the through-hole 107 in the region A in FIG. 9, thereby causing adhesion between the bonded parts of the connection terminal and the through-hole to decrease. When a power semiconductor module in such a state is used in a location where vibration is intense, there is the possibility that the electrical connection between the connection terminal 103 and the through-hole 107 will be broken, and the reliability of the power semiconductor module will decrease.

In order to resolve the above-mentioned problems with conventional technology, an aim of the present invention is to provide a semiconductor device and a manufacturing method of a semiconductor device that are able to maintain a gap between a connection terminal and a through-hole, and ensure a uniform solder thickness for the bonded parts of the connection terminal and the through-hole.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a sealed unit that includes a semiconductor element sealed therein, the sealed unit having a flat face on which a wiring board is to be mounted; a connection terminal that is electrically connected to the semiconductor element sealed within the sealed unit and that has a projected portion upright projecting outward from the flat face of the sealed unit; and a pedestal disposed so as to surround a bottom part of the projected portion of the connection terminal, exposing a top part of the projected portion of the connection terminal so as to be connected to the wiring board, wherein the pedestal includes a base attached to the flat face of the sealed unit and a guide part on the base, the guide part having an inclined side face that is inclined relative to the flat face of the sealed unit.

In the semiconductor device according to the present invention, the inclined side face of the guide part may meet the top part of the projected portion of the connection terminal without having a horizontal segment on a top surface of the guide part that is parallel to the flat face of the sealed unit.

Furthermore, in the semiconductor device according to the present invention, an angle formed by the inclined side face relative to the flat face of the sealed unit may be greater than 30° and less than 90°.

Additionally, in the semiconductor device according to the present invention, an angle formed by a side face of the base relative to the flat face of the sealed unit may be no less than an angle formed by the inclined side face relative to the flat face of the sealed unit, and the angle formed by the side face of the base relative to the flat face of the sealed unit may be greater than 30° and no more than 90°.

Moreover, in the semiconductor device according to the present invention, a ratio of a height of the guide part to a sum of the height of the guide part and a height of the base may be at least 0.05 and no greater than 0.50.

In the semiconductor device according to the present invention, the flat face of the sealed unit on which the wiring board is to be mounted may be a front surface of the sealed unit.

In the semiconductor device according to the present invention, the pedestal that includes the base and the guide part may be integrally formed with the flat face of the sealed unit.

In order to resolve the above-described problems and achieve the aim of the present invention, in another aspect, the present disclosure provides a manufacturing method of a semiconductor device, including: preparing a semiconductor element; installing a connection terminal that is electrically connected to the semiconductor element; and placing the semiconductor element and the connection terminal in a mold and injecting a resin into the mold so as to create a sealed unit such that: the sealed unit has a flat face on which a wiring board is to be mounted the connection terminal has a projected portion upright projecting outward from the flat face of the sealed unit; and a pedestal made of the injected resin is integrally formed with the sealed unit so as to surround a bottom part of the projected portion of the connection terminal, exposing a top part of the projected portion of the connection terminal so as to be connected to the wiring board, wherein the pedestal includes a base attached to the flat face of the sealed unit and a guide part on the base, the guide part having an inclined side face that is inclined relative to the flat face of the sealed unit.

According to the above-described invention, a pedestal formed of a base and a guide part having an inclined section is provided on a connection terminal in a semiconductor device. As a result, inserting the connection terminal into a through-hole of a wiring board becomes easy, and positioning of the wiring board becomes easy. Furthermore, it becomes possible to support the wiring board by ensuring proper clearance between the wiring board and the connection terminal. Thus, it is possible to inject a sufficient amount of solder between the connection terminal and the through-hole, it is possible to improve adhesion between the bonded parts of the connection terminal and the through-hole, and vibration resistance of the semiconductor device improves.

According to a semiconductor device and a manufacturing method of a semiconductor device according to the present invention, an effect is exhibited in which it is possible to maintain a gap between a connection terminal and a through-hole, and to ensure a uniform solder thickness for the bonded parts of the connection terminal and the through-hole.

It is to be understood that both the foregoing general description and the following detailed description are exemplary and explanatory, and are intended to provide further explanation of the invention as claimed.

BRIEF DESCRIPTION OF THE DRAWINGS

FIG. 6 is a table that shows the height of a base and the height of a guide part in power semiconductor modules according to working examples.

DETAILED DESCRIPTION OF EMBODIMENTS

Preferred embodiments of a semiconductor device and a manufacturing method of a semiconductor device according to the present invention will be described in detail below with reference to the attached drawings. As a result of thorough research, the inventors discovered that by changing the shape of the pedestal provided on the connection terminal, it is possible to maintain the gap between the connection terminal and the through-hole, and to ensure a uniform solder thickness for the bonded parts of the connection terminal and the through-hole.

EMBODIMENTS

Figure 1:
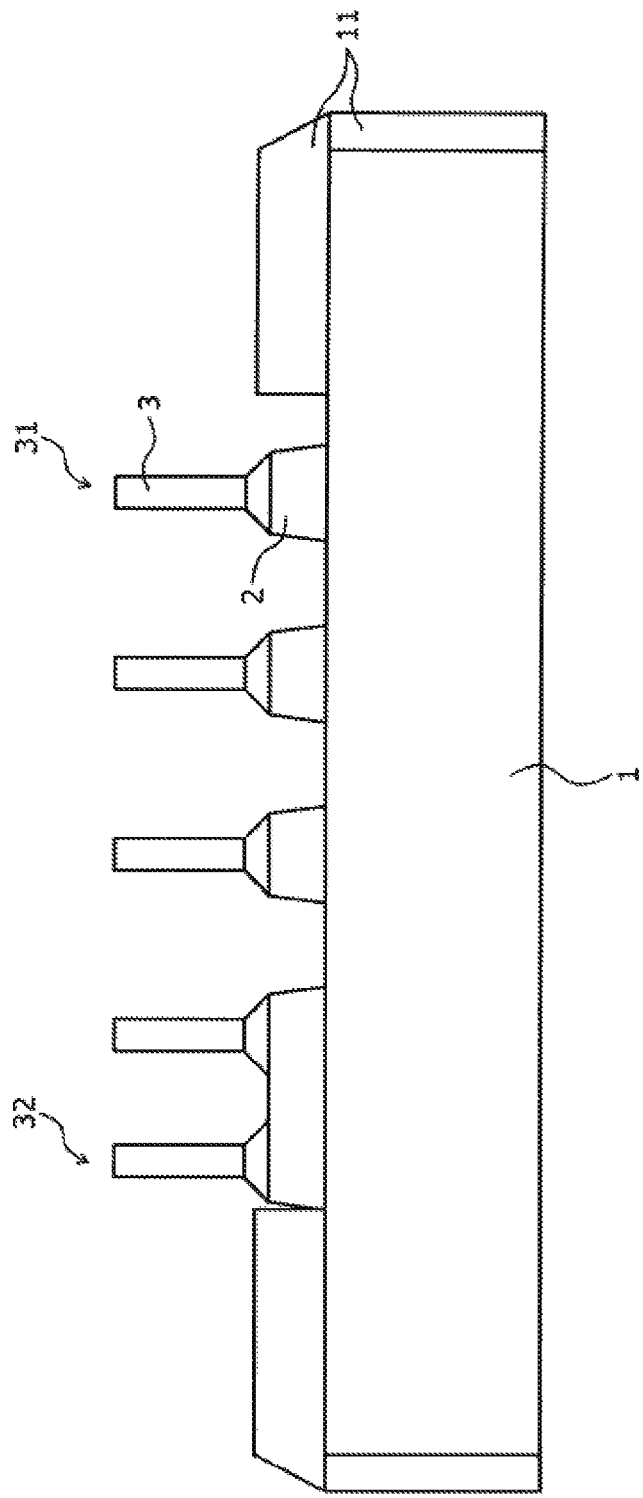
FIG. 1 is a side view that shows a power semiconductor module according to an embodiment of the present invention.

FIG. 1 is a side view that shows a power semiconductor module according to an embodiment of the present invention. The power semiconductor module includes: a sealed unit 1 that has a power semiconductor chip (not shown) therein; connection terminals 3 that are connected to the power semiconductor chip and project outward from the sealed unit 1; and pedestals 2 that are provided on the connection terminals 3.

The connection terminals 3 are provided on a front surface of the sealed unit 1. The pedestals 2 are respectively provided on the bases of the connection terminals 3. A bottom surface of the pedestal 2 contacts the front surface of the sealed unit 1, and the connection terminal 3 is exposed from a top surface (a surface opposite of the surface that contacts the sealed unit 1) of the pedestal 2. The top surface of the pedestal 2 is located higher than the sealed unit 1, or in other words, located closer to the top end of the connection terminal 3 than the sealed unit 1. In addition, in the power semiconductor module, a heat-dissipating member such as a heat-dissipating fin or a water-cooling jacket may be attached to a rear surface of the sealed unit 1. In such a case, a fastening section 11 for attaching the heat-dissipating member can be included on the sealed unit 1. The top surface of the pedestal 2 should be located higher than the sealed unit 1 that includes the fastening section 11, or in other words, located closer to the top end of the connection terminal 3 than the sealed unit 1.

Thermosetting resins or thermoplastic resins can be used for the sealed unit 1 and the pedestal 2. Furthermore, the sealed unit 1 and the pedestal 2 may include an adhesive supplement. In addition, the sealed unit 1 and the pedestal 2 may, according to the purpose, include a microfiller or nanofiller, as an inorganic filler, formed of inorganic particles such as silica, alumina, boron nitride, or aluminum nitride.

The power semiconductor chip is formed of a material such as silicon (Si), silicon carbide (SiC), or gallium nitride (GaN). The power semiconductor chip includes a switching element such as an IGBT or a power MOSFET (metal-oxide-semiconductor field-effect transistor). Such a power semiconductor chip respectively includes: a drain electrode (or a collector electrode) as a primary electrode on a rear surface of the chip, and a gate electrode and a source electrode (or an emitter electrode) as primary electrodes on a front surface of the chip, for example.

In addition, the power semiconductor chip includes, as necessary, a diode such as an SBD (Schottky barrier diode) or a FWD (free-wheeling diode). Such a power semiconductor chip respectively includes a cathode electrode as a primary electrode on the rear surface of the chip, and an anode electrode as a primary electrode on the front surface of the chip. For the above-mentioned power semiconductor chip, the electrodes on the rear surface side of the chip are bonded to a front surface of a prescribed conducting plate (not shown) via a bonding material (not shown). In addition, the above-mentioned power semiconductor chip is sealed inside the sealed unit 1 via a resin.

The conducting plate is a plate made of copper or the like that is provided on a front surface that is one surface of an insulating substrate, and is sealed inside the sealed unit 1 via a resin. A heat dissipation plate of copper or the like is disposed on a rear surface that is another surface of the insulating substrate, and a multilayer substrate is formed of the conducting plate, the insulating substrate, and the heat dissipation plate. While not shown in the drawings, a plurality of power semiconductor chips are mounted on the front surface of the conducting plate in the multilayer substrate via a conductive bonding layer. Furthermore, metal wiring is disposed on the front surface of the power semiconductor chips. Instead of the metal wiring, metal terminals may be connected via the conductive bonding layer. An implant-type printed board that includes metal terminals (implant pins) may be attached via the conductive bonding layer. A lead frame may be attached to the front surface of the power semiconductor chips. The insulating substrate and the heat dissipation plate may be sealed inside the sealed unit 1 via a resin or exposed to the exterior without being sealed.

The conducting plate may be the lead frame. In such a case, the plurality of power semiconductor chips are mounted on the front surface of the conducting plate via the conductive bonding layer. The rear surface of the conducting plate may be sealed inside the sealed unit 1 or exposed to the exterior without being sealed. For such a conducting plate, at least the front surface is sealed inside the sealed unit 1.

The connection terminals 3 are conductive metal terminals made of copper (Cu), for example. Plating of nickel (Ni), tin (Sn), or the like may be carried out on the surface of the connection terminals 3. One ends of the connection terminals 3 are electrically connected to the respective electrodes of the power semiconductor chips via the conductive bonding layer or the conducting plate (not shown) inside the sealed unit 1. The other ends of the connection terminal 3 are electrically connected to a wiring board (not shown) disposed outside the power semiconductor module. The wiring board is a bus bar, wiring substrate, or control substrate, for example. In addition, pedestals 2 for supporting the wiring board are provided on the connection terminals 3.

Figure 2:
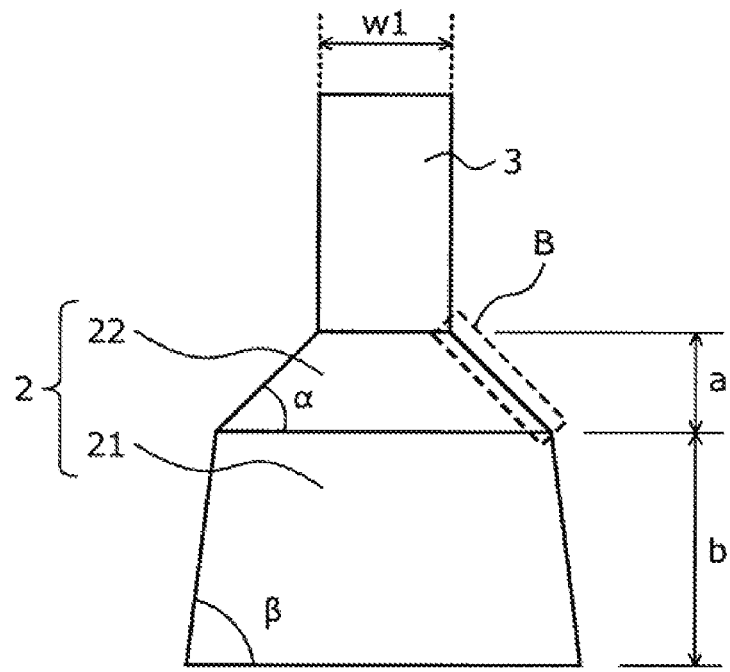
FIG. 2 is an enlarged side view of a connection terminal of the power semiconductor module according to the embodiment.

FIG. 2 is an enlarged side view of a connection terminal of the power semiconductor module according to the embodiment. As shown in FIG. 2, the pedestal 2 provided on the connection terminal 3 is formed of a base 21 and a guide part 22. The base 21 contacts the front surface of the sealed unit 1, and the guide part 22 is provided on top of the base 21. In addition, the guide part 22 has an inclined section. The inclined section is a part that is inclined with respect to a top surface (the surface opposite of the surface contacting the sealed unit 1) of the base 21, and the inclined section of the guide part 22 corresponds to a part B in FIG. 2.

In FIG. 2, the inclined section of the guide part 22 is inclined at an angle of inclination $\alpha$. The angle of inclination $\alpha$ is an angle formed by the inclined section of the guide part 22 and the top surface of the base 21. The base 21 may have an inclined section with an angle of inclination $\beta$. The angle of inclination $\beta$ is an angle formed by the inclined section of the base 21 and the top surface of the sealed unit 1. A flat section is not formed on the top surface of the guide part 22. Thus, the inclined section and the connection terminal 3 are continuous, and a width w1 of the top surface (the surface opposite of the surface that contacts the base 21) of the guide part 22 and the width of the connection terminal 3 are the same.

The angle of inclination $\alpha$ of the guide part 22 is less than or equal to the angle of inclination $\beta$ of the base 21. The angle of inclination $\alpha$ satisfies $30°<\alpha<90°$, and the angle of inclination $\beta$ satisfies $30°<\beta\leq90°$. In addition, the ratio of a height a of the guide part 22 with respect to the sum of the height a of the guide part 22 and a height b of the base 21, or in other words, $a/(a+b)$ is preferably greater than or equal to 0.05 and less than or equal to 0.50. It is more preferable that this ratio be greater than or equal to 0.10 and less than or equal to 0.30, with greater than or equal 0.15 and less than or equal to 0.25 being even more preferable. As a result of using such angles and heights, inserting the connection terminal 3 in the through-hole of the wiring board becomes easy, and positioning the wiring board becomes easy. In addition, as shown in FIG. 3 below, it becomes possible to support the wiring board via the inclined section while ensuring proper clearance between the wiring board and the connection terminal.

Figure 3:
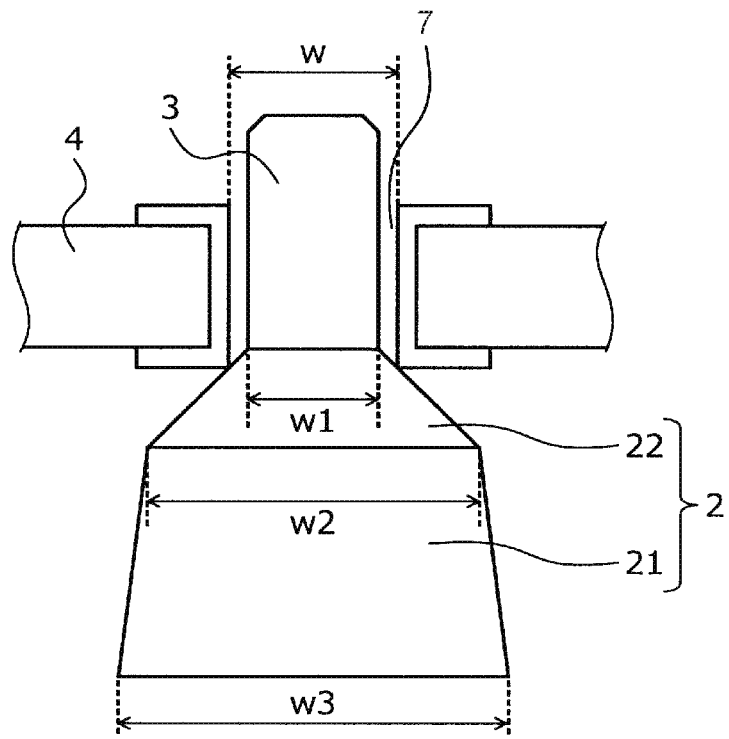
FIG. 3 is an enlarged side view of the vicinity of the connection terminal when the power semiconductor module according to the embodiment is connected to a wiring board.

FIG. 3 is an enlarged side view of the vicinity of the connection terminal when the power semiconductor module according to the embodiment is connected to a wiring board. Here, the width w1 of the top surface of the guide part 22 is narrower than a width w of a through-hole 7 of a wiring board 4, and a width w2 of a bottom surface (a surface that contacts the base 21) of the guide part 22 is wider than the width w of the through-hole 7 of the wiring board 4. Since the width w1 of the top surface of the guide part 22 is the same as the width of the connection terminal 3, the width of the connection terminal 3 is narrower than the width w of the through-hole 7 of the wiring board 4.

Thus, the connection terminal 3 is inserted in the through-hole 7 of the wiring board 4, and the wiring board 4 is supported by the inclined section of the guide part 22. As a result, even if the formation location of the connection terminal 3 or the formation location of the through-hole 7 shifts, the inclined section is able to compensate for the formation location shifting, and clearance between the connection terminal 3 and the through-hole 7 is ensured. Thus, it is possible to inject a sufficient amount of solder between the connection terminal 3 and the through-hole 7, and thus adhesion between the bonded parts of the connection terminal 3 and the through-hole 7 can be improved, thereby improving the vibration resistance of the power semiconductor module.

In addition, a width w3 of the bottom surface of the base 21 may be the same width as the width w2 of the top surface of the base 21, or may be wider.

It is possible to adopt a shape other than that shown in FIG. 2 for the connection terminals of the power semiconductor module according to the embodiment. FIGS. 4A to 4E are enlarged side views of connection terminals with other shapes in the power semiconductor module according to the embodiment.

Figure 4A:
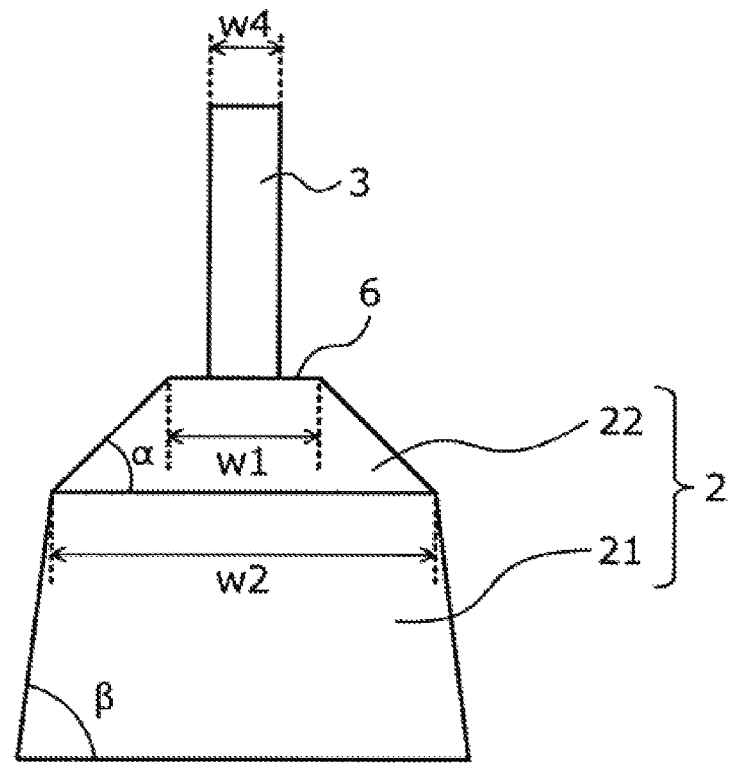
FIG. 4A is a (first) enlarged side view of a connection terminal having a different shape in a power semiconductor module according to an embodiment.

FIG. 4A is a shape in which a width w4 of the connection terminal 3 is narrower than that in FIG. 2, and in which a flat section 6 is formed on the top surface of the guide part 22. In such a case, the width w1 of the top surface of the guide part 22 is made narrower than the width w of the through-hole 7 in the wiring board 4, and the width w2 of the bottom surface of the guide part 22 is made wider than the width w of the through-hole 7 in the wiring board 4. As a result, the wiring board 4 is not supported by the flat section 6, but the through-hole 7 in the wiring board 4 is supported by the guide part 22. Thus, as with the case for FIG. 2, it is possible to ensure clearance between the connection terminal 3 and the through-hole 7.

Figure 4B:
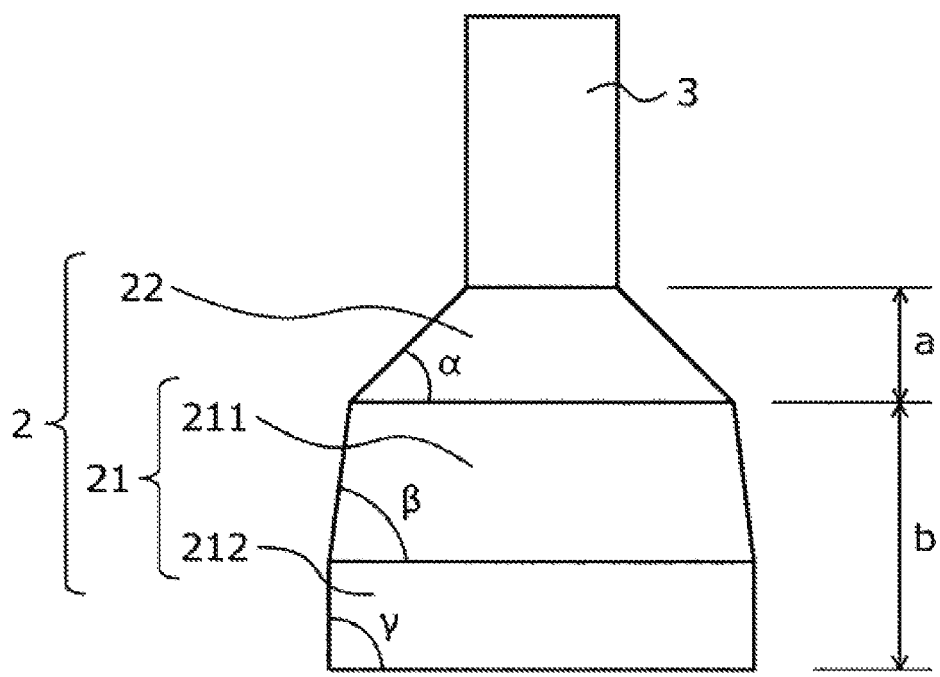
FIG. 4B is a (second) enlarged side view of a connection terminal having a different shape in a power semiconductor module according to an embodiment.
Figure 4C:
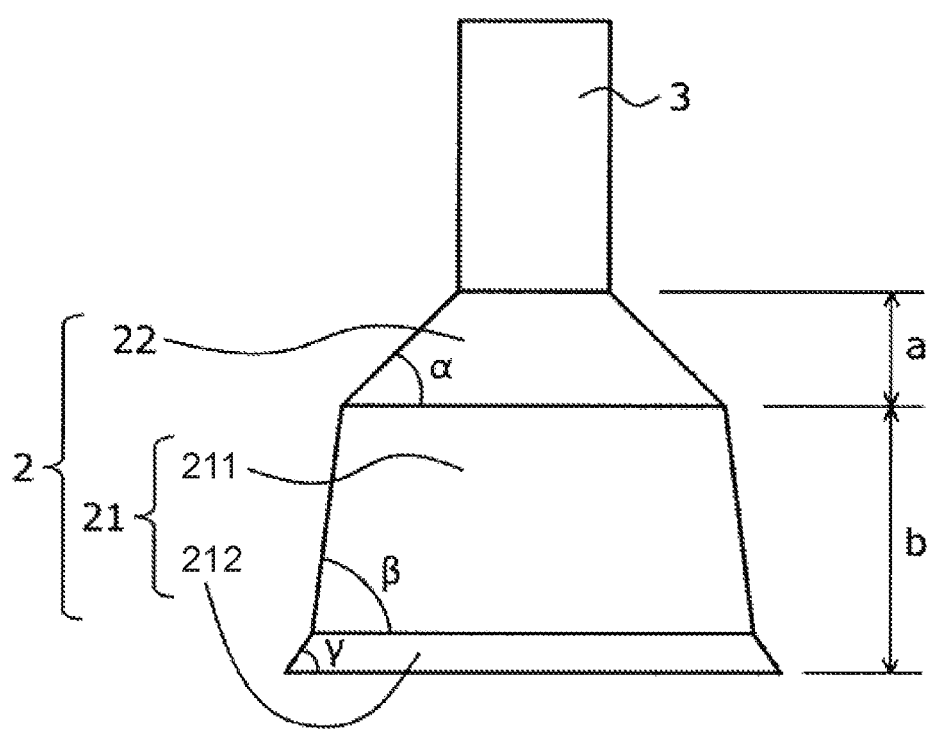
FIG. 4C is a (third) enlarged side view of a connection terminal having a different shape in a power semiconductor module according to an embodiment.

FIGS. 4B, 4C are shapes in which the base 21 is formed of an upper base 211 and a lower base 212. Thus, the base 21 has the upper base 211 with the angle of inclination β, the lower base 212 with an angle of inclination γ, and a plurality of inclined sections. FIG. 4B is an example in which the angle of inclination γ has a right angle shape, and FIG. 4C is an example in which the angle of inclination γ has an acute angle shape. In such a case, the angle of inclination α is preferably equal to or smaller than the angle of inclination β, and the angle of inclination γ is not dependent on the angle of inclination α or the angle of inclination β.

Figure 4D:
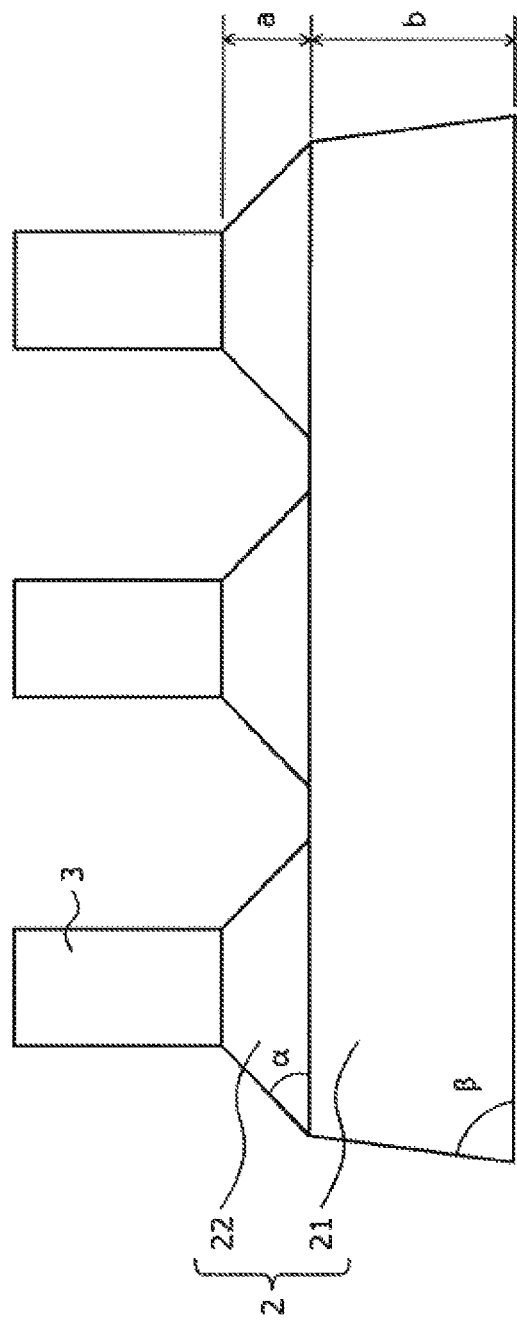
FIG. 4D is a (fourth) enlarged side view of a connection terminal having a different shape in a power semiconductor module according to an embodiment.

FIG. 4D is a shape in which a plurality of guide parts 22 and a plurality of connection terminals 3 are provided for one base 21. In addition, the guide parts 22 and the connection terminals 3 provided on the one base 21 may be formed in a single row as in FIG. 4D, or in a plurality of rows. In the case of FIG. 4D, the angle of inclination β becomes the angle of a side edge of the base.

Figure 4E:
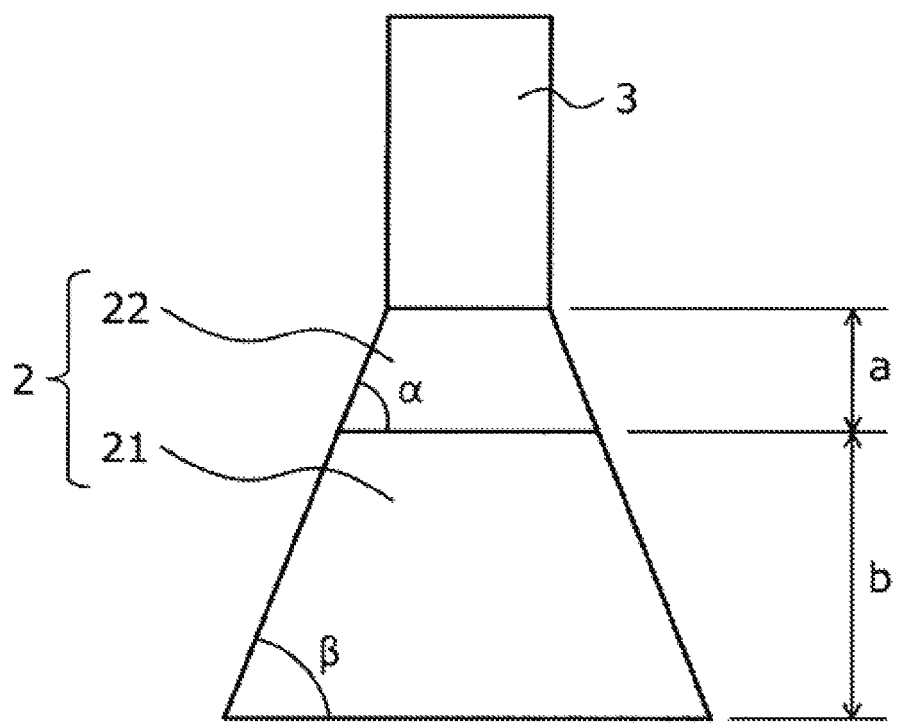
FIG. 4E is a (fifth) enlarged side view of a connection terminal having a different shape in a power semiconductor module according to an embodiment.

FIG. 4E is a shape in which the angle of inclination α of the guide part 22 and the angle of inclination β of the base 21 are the same angle. In such a case, the guide part 22 and the base 21 are integrated.

In addition, in FIGS. 4A to 4E, the angle of inclination α of the guide part 22 and the angle of inclination β of the base 21 may be the same values as in the case of FIG. 2. Furthermore, the ratio of the height a of the guide part 22 to the sum of the height a of the guide part 22 and the height b of the base 21 may be the same value as in the case of FIG. 2. Thus, similar to the shape in FIG. 2, inserting the connection terminal 3 into the through-hole 7 of the wiring board 4 becomes easy, and positioning the wiring board becomes easy. In addition, it becomes possible to support the wiring board 4 while ensuring proper clearance between the wiring board 4 and the connection terminal 3.

In addition, while the inclined sections in the above-mentioned pedestal 2 shape were straight lines, the inclined section of one or both of the base 21 and the guide part 22 may be curved. When curved, the angle of inclination α of the guide part 22 is the average inclination angle of the inclined section of the guide part 22, and the angle of inclination β of the base 21 is the average inclination angle of the inclined section of the base 21. Similarly, the angle of inclination β and the angle of inclination γ in FIGS. 4B and 4C are respectively the average inclination angles of the inclined sections of the upper base 211 and the lower base 212.

Figure 5A:
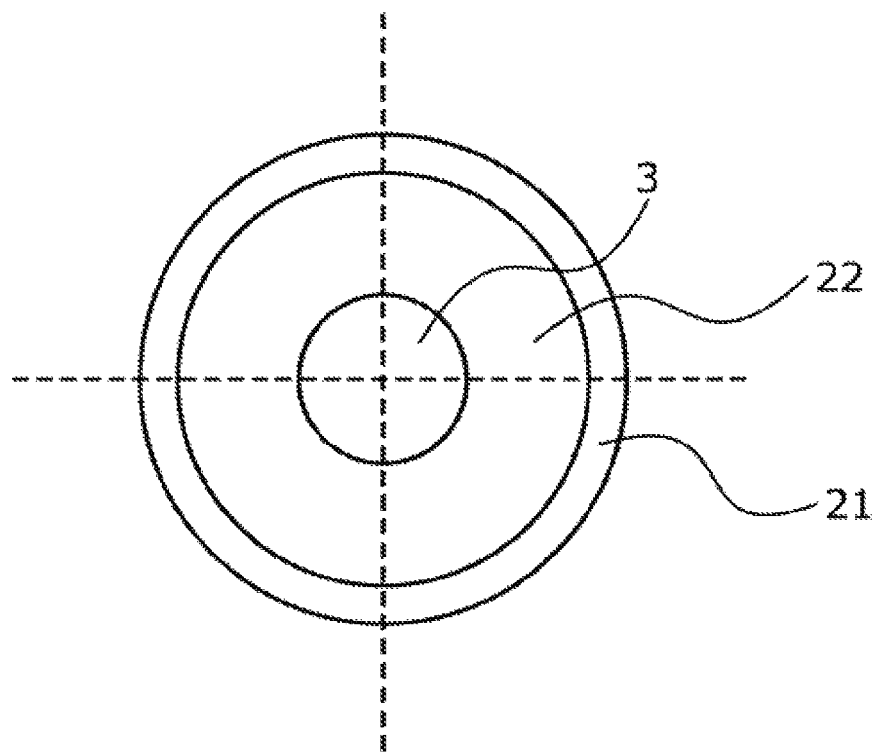
FIG. 5A is a (first) top view of a connection terminal in a power semiconductor module according to an embodiment.
Figure 5B:
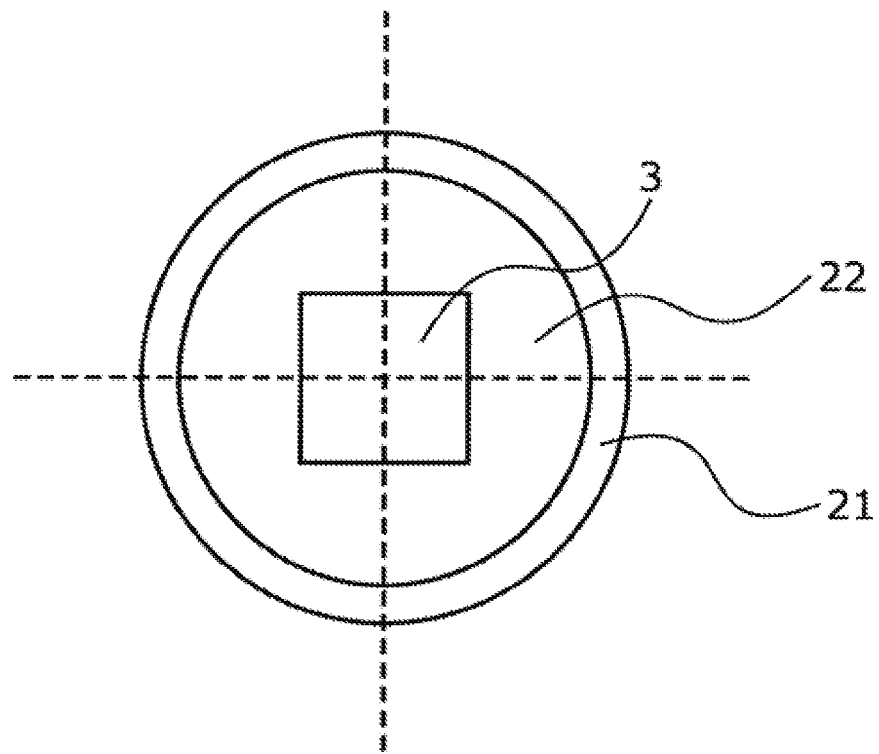
FIG. 5B is a (second) top view of a connection terminal in a power semiconductor module according to an embodiment.
Figure 5C:
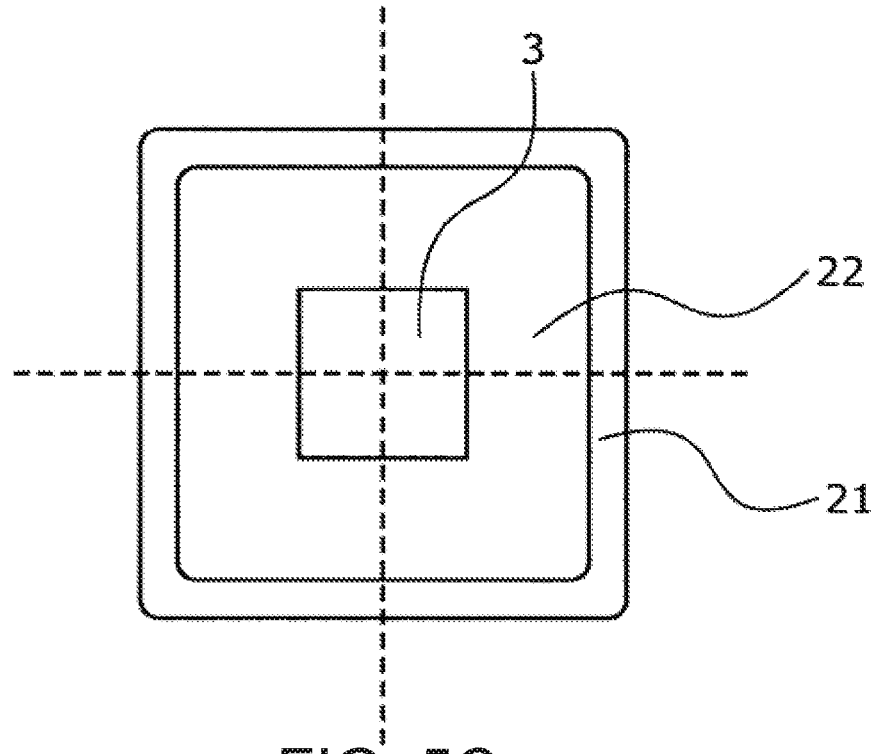
FIG. 5C is a (third) top view of a connection terminal in a power semiconductor module according to an embodiment.
Figure 5D:
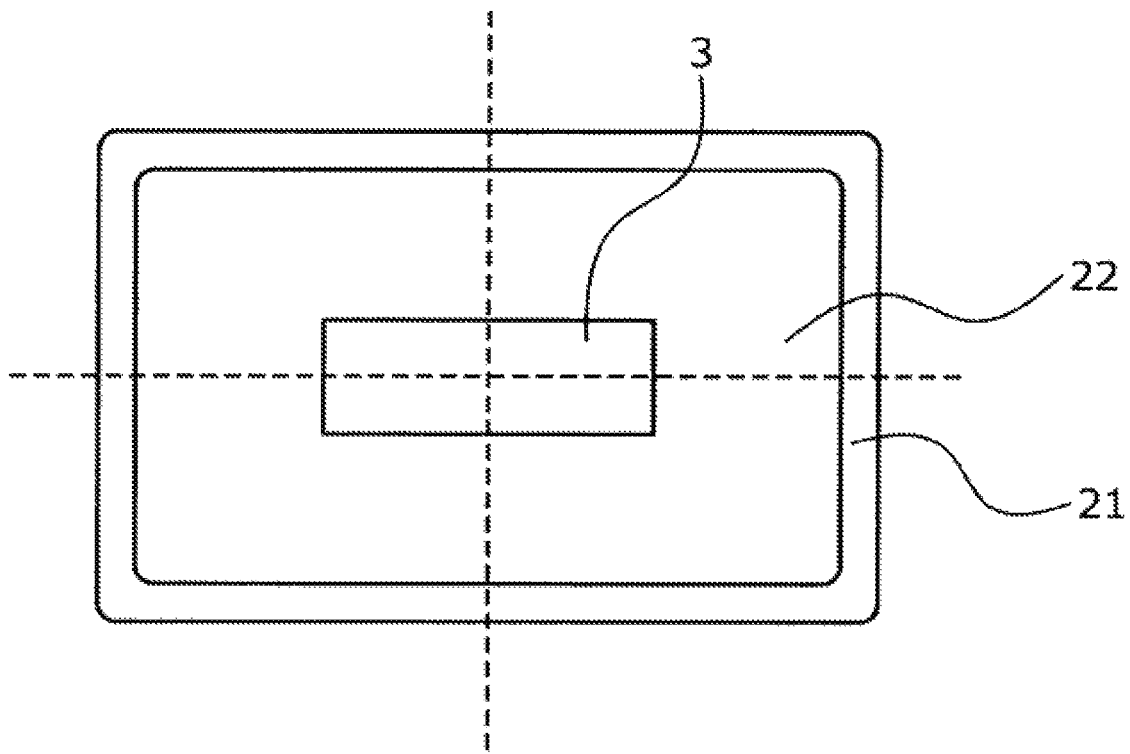
FIG. 5D is a (fourth) top view of a connection terminal in a power semiconductor module according to an embodiment.
Figure 7:
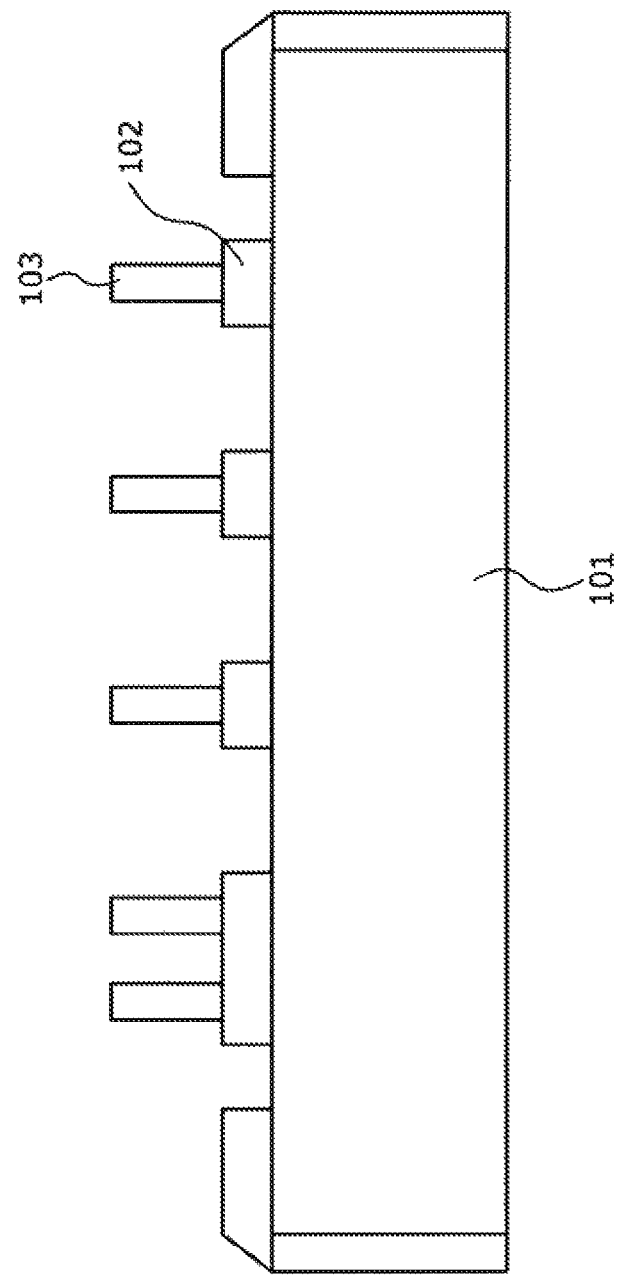
FIG. 7 is a side view that shows a conventional power semiconductor module.
Figure 8:
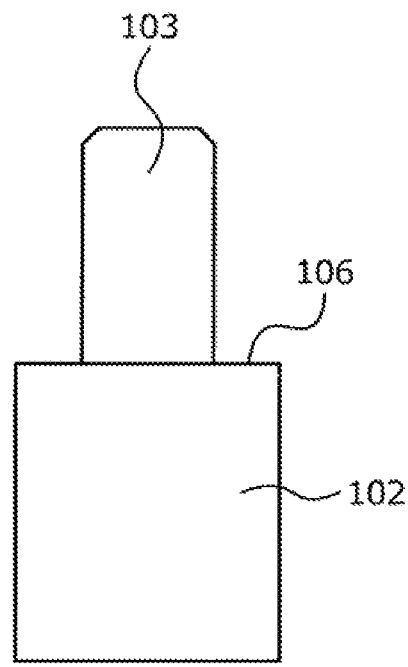
FIG. 8 is an enlarged side view of a connection terminal in the conventional power semiconductor module.
Figure 9:
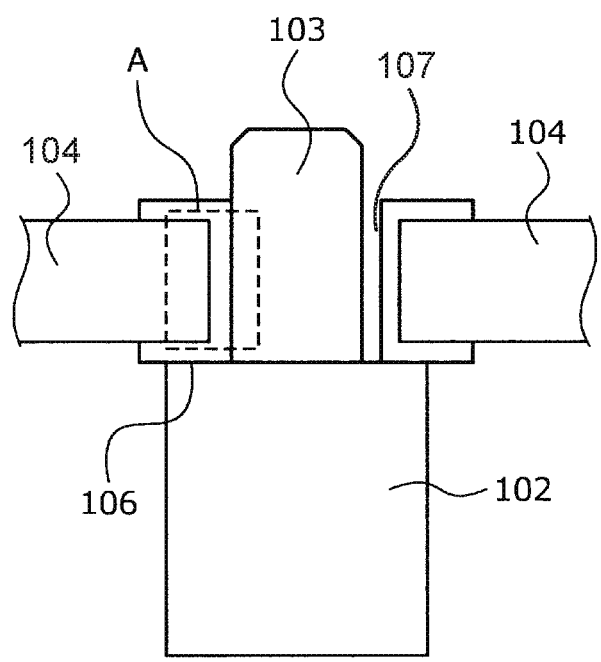
FIG. 9 is an enlarged side view of the vicinity of the connection terminal when the conventional power semiconductor module has been connected to a wiring board.

Next, top views of the connection terminal 3 will be shown. FIGS. 5A to 5D are top views of connection terminals in power semiconductor modules according to embodiments. FIG. 5A is a shape in which the connection terminal 3 is a cylinder, and the base 21 and the guide part 22 are circular truncated cones. In addition, FIG. 5B is a shape in which the connection terminal 3 is a prism, and the base 21 and the guide part 22 are circular truncated cones. Furthermore, FIG. 5C is a shape in which the connection terminal 3 is a prism, and the base 21 and the guide part 22 are truncated pyramids. Additionally, FIG. 5D is a shape in which the connection terminal 3 is a plate-shaped prism, and the base 21 and the guide part 22 are rectangular truncated pyramids.

In addition, the base 21 and the guide part 22 may be of different shapes. For example, the base 21 may be a truncated pyramid and the guide part 22 may be a circular truncated cone, or the base 21 may be a circular truncated cone and the guide part 22 may be a truncated pyramid. In addition, the truncated pyramids can be of a shape different from the rectangular truncated pyramids in FIGS. 5B to 5D, and may be hexagonal truncated pyramids, for example. Furthermore, the cylinders may be elliptical cylinders, and the circular truncated cones may be elliptical truncated cones.

The shapes of the connection terminals 3 shown in the side views of FIGS. 4A to 4E and the top views of FIGS. 5A to 5D can be mixed and used in one power semiconductor module. In other words, in the power semiconductor module, the shapes of the connection terminals 3 do not need to be the same shape, and may be different shapes.

A manufacturing method of such a power semiconductor module is the same as for a power semiconductor module according to conventional technology. In the manufacturing method of the power semiconductor module, the multilayer substrate, in which the conducting plate is provided on the front surface of the insulating substrate and the heat dissipation plate is provided on the rear surface of the insulating substrate, is first prepared. Next, the power semiconductor chips are mounted on the front surface of the conducting plate provided in the multilayer substrate, and the power semiconductor chips and the conductive plate are electrically connected. Next, the power semiconductor chips and the connection terminal 3 are electrically connected via metal wiring or the like. In this manner, a power semiconductor circuit member forming a switching circuit is assembled. Instead of the multilayer substrate, a lead frame formed of only the conducting plate may be used. Even in such a case, a power semiconductor circuit member forming a switching circuit can be assembled in a similar manner.

Next, the connection terminals 3 that are electrically connected to the power semiconductor chips via the conducting plate are provided upright on the power semiconductor circuit member. Next, the power semiconductor circuit member is set inside a mold for resin molding, and the mold is filled with a resin made of a hard resin such as an epoxy. By incorporating the shapes corresponding to the sealed unit 1 and the pedestal 2 in this mold, the sealed unit 1 and the pedestal 2 are integrally molded. At such time, by incorporating the shapes corresponding to the pedestal 2 formed of the base 21 and the guide part 22 having an inclined section, the pedestal 2 of the embodiment is formed. The resin molding may be transfer molding or injection molding. As a result, the power semiconductor module according to the embodiment shown in FIG. 1 is completed.

WORKING EXAMPLES

FIG. 6 is a table that shows the height of the base and the height of the guide part in power semiconductor modules according to working examples of the present invention. This table shows the values for the height b of the base 21, the height a of the guide part 22, and the respective sums a+b for Working Examples 1 to 3, with the units being in mm Here, Working Example 1 is an example in which a/(a+b) is greater than or equal to 0.05 and less than or equal to 0.50, Working Example 2 is an example in which a/(a+b) is in the more preferable range of greater than or equal 0.10 and less than or equal to 0.30, and Working Example 3 is an example in which a/(a+b) is in the even more preferable range of greater than or equal to 0.15 and less than or equal 0.25.

In each of these working examples, it is possible to support the wiring board 4 via the inclined section by ensuring proper clearance between the wiring board 4 and the connection terminal 3.

While in FIG. 1 the pedestal 2 formed of the base 21 and the guide part 22 having an inclined section is provided on all of the connection terminals 3, it is not necessary to provide a pedestal 2 for all of the connection terminals 3. For example, a pedestal 2 formed of the base 21 and the guide part 22 having the inclined section may be provided only on the connection terminals 3 (terminals 31 and 32 in FIG. 1, for example) that are at the ends of the power semiconductor module. This is because if the wiring board 4 can be supported using these ends, it is possible to reliably fix the wiring board 4.

Furthermore, as in FIG. 4D, even in a case in which a plurality of connection terminals 3 are provided for one base 21, a pedestal 2 formed of the base 21 and the guide part 22 having an inclined section may not necessarily be provided for all of the connection terminals 3. In such a case, a pedestal 2 formed of the base 21 and the guide part 22 having an inclined section may be provided only on the outermost connection terminals 3.

As described above, according to the semiconductor device of the embodiments, a pedestal formed of a base and a guide part having an inclined section is provided on a connection terminal. As a result, it becomes easy to insert the connection terminal in a through-hole of a wiring board, and positioning the wiring board becomes easy. Furthermore, it becomes possible to support the wiring board while ensuring proper clearance between the wiring board and the connection terminal. Thus, it is possible to inject a sufficient amount of solder between the connection terminal and the through-hole, it is possible to improve adhesion between the bonded parts of the connection terminal and the through-hole, and vibration resistance of the semiconductor device improves.

The present invention described above is not limited to the embodiments described above, and various modifications can be made to the present invention without departing from the spirit thereof. For example, a mold-type power semiconductor module was described as examples; however, the present invention can also be applied to a terminal case insert-molded via a thermoplastic resin such as polyphenylene sulfide (PPS) in order to fix a metal terminal that extracts a signal to the external. In such a case, a pedestal for supporting the wiring board is provided on the connection terminal, and the pedestal is able to achieve a similar effect by being formed of a base and a guide part in a similar manner to the embodiments. In addition, for example, a power semiconductor module having connection terminals 3 on a front surface (a conducting plate-side top surface on which power semiconductor chips have been mounted) of a sealed unit 1 was described as examples; however, the present invention can also be applied to cases that have connection terminals on the side faces or the bottom surface of the sealed unit. Even in such cases, a pedestal for supporting the wiring board is provided on the connection terminal, and the pedestal is able to achieve a similar effect by being formed of a base and a guide part in a similar manner to the embodiments.

INDUSTRIAL APPLICABILITY

As described above, a semiconductor device and a manufacturing method of a semiconductor device according to the present invention are useful in power semiconductor devices used in power conversion devices such as inverters, power devices such as various types of industrial machinery, automotive power control units, and the like.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A semiconductor device, comprising:
a wiring board having a through-hole;
a sealed unit that includes a semiconductor element sealed therein, the sealed unit having a flat face above which the wiring board is to be mounted;
a connection terminal that is electrically connected to the semiconductor element sealed within the sealed unit and that has a projected portion upright projecting outward from the flat face of the sealed unit; and
a pedestal disposed so as to surround a bottom part of the projected portion of the connection terminal, exposing a top part of the projected portion of the connection terminal so as to be connected to the wiring board, the pedestal being made of a thermosetting resin or a thermoplastic resin,
wherein the pedestal includes a base attached to the flat face of the sealed unit and a guide part on the base, the guide part having an inclined side face that is inclined relative to the flat face of the sealed unit on every side of the guide part, the inclined side face of the guide part being in direct contact with an edge of the through-hole of the wiring board so as to support the wiring board.

2. The semiconductor device according to claim 1, wherein the inclined side face of the guide part meets the top part of the projected portion of the connection terminal without having a horizontal segment on a top surface of the guide part that is parallel to the flat face of the sealed unit.

3. The semiconductor device according to claim 1, wherein an angle formed by the inclined side face relative to the flat face of the sealed unit is greater than 30° and less than 90°.

4. The semiconductor device according to claim 2, wherein an angle formed by the inclined side face relative to the flat face of the sealed unit is greater than 30° and less than 90°.

5. The semiconductor device according to claim 1,
wherein an angle formed by a side face of the base relative to the flat face of the sealed unit is no less than an angle formed by the inclined side face relative to the flat face of the sealed unit, and
wherein the angle formed by the side face of the base relative to the flat face of the sealed unit is greater than 30° and less than 90°.

6. The semiconductor device according to claim 2,
wherein an angle formed by a side face of the base relative to the flat face of the sealed unit is no less than an angle formed by the inclined side face relative to the flat face of the sealed unit, and
wherein the angle formed by the side face of the base relative to the flat face of the sealed unit is greater than 30° and less than 90°.

7. The semiconductor device according to claim 3,
wherein an angle formed by a side face of the base relative to the flat face of the sealed unit is no less than the angle formed by the inclined side face relative to the flat face of the sealed unit, and
wherein the angle formed by the side face of the base relative to the flat face of the sealed unit is greater than 30° and less than 90°.

8. The semiconductor device according to claim 4,
wherein an angle formed by a side face of the base relative to the flat face of the sealed unit is no less than the angle formed by the inclined side face relative to the flat face of the sealed unit, and
wherein the angle formed by the side face of the base relative to the flat face of the sealed unit is greater than 30° and less than 90°.

9. The semiconductor device according to claim 1, wherein a ratio of a height of the guide part to a sum of the height of the guide part and a height of the base is at least 0.05 and no greater than 0.50.

10. The semiconductor device according to claim 2, wherein a ratio of a height of the guide part to a sum of the height of the guide part and a height of the base is at least 0.05 and no greater than 0.50.

11. The semiconductor device according to claim 3, wherein a ratio of a height of the guide part to a sum of the height of the guide part and a height of the base is at least 0.05 and no greater than 0.50.

12. The semiconductor device according to claim 5, wherein a ratio of a height of the guide part to a sum of the height of the guide part and a height of the base is at least 0.05 and no greater than 0.50.

13. The semiconductor device according to claim 8, wherein a ratio of a height of the guide part to a sum of the height of the guide part and a height of the base is at least 0.05 and no greater than 0.50.

14. The semiconductor device according to claim 1, wherein the flat face of the sealed unit on which the wiring board is to be mounted is a front surface of the sealed unit.

15. The semiconductor device according to claim 1, wherein the pedestal that includes the base and the guide part is integrally formed with the flat face of the sealed unit.

16. The semiconductor device according to claim 1,
wherein the connection terminal is provided in a plurality and the pedestal is provided in a plurality corresponding to the plurality of the connecting terminals, and
wherein the plurality of pedestals shares a single shared base and each of the plurality of pedestals includes said guide part on the single shared base.

17. The semiconductor device according to claim 1,
wherein the base includes a lower base and an upper base on the lower base,
wherein an angle formed by a side face of the upper base relative to the flat face of the sealed unit is no less than an angle formed by the inclined side face relative to the flat face of the sealed unit, and
wherein an angle formed by the side face of the upper base relative to the flat face of the sealed unit is different from an angle formed by a side face of the lower base relative to the flat face of the sealed unit.

18. The semiconductor device according to claim 1, wherein the inclined side face of the guide part occupies an entirety of a surface connecting a bottom circumference edge of the exposed top part of the projected portion of the n al and a top circumference edge of the base.

19. The semiconductor device according to claim 1, wherein the pedestal that includes the base and the guide part is integrally formed with the sealed unit or a terminal case that supports the connection terminal.

20. A manufacturing method of a semiconductor device, comprising:
preparing a semiconductor element;
installing a connection terminal that is electrically connected to the semiconductor element; and
placing the semiconductor element and the connection terminal in a mold and injecting a resin that is a thermosetting resin or a thermoplastic resin into the mold so as to create a sealed unit such that:
the sealed unit has a flat face on which a wiring board is to be mounted;
the connection terminal has a projected portion upright projecting outward from the flat face of the sealed unit; and
a pedestal made of the injected resin is integrally formed with the sealed unit so as to surround a bottom part of the projected portion of the connection terminal, exposing a top part of the projected portion of the connection terminal so as to be connected to the wiring board,
wherein the pedestal includes a base attached to the flat face of the sealed unit and a guide part on the base, the guide part having an inclined side face that is inclined relative to the flat face of the sealed unit.

* * * * *

UNITED STATES PATENT AND TRADEMARK OFFICE
CERTIFICATE OF CORRECTION

PATENT NO. : 10,966,322 B2  
APPLICATION NO. : 16/241099  
DATED : March 30, 2021  
INVENTOR(S) : Hayato Nakano Page 1 of 1

It is certified that error appears in the above-identified patent and that said Letters Patent is hereby corrected as shown below:

In the Specification

Column 6, Line 31, the text "with an angle of inclination (3" should be changed to -- with an angle of inclination $\beta$ --.

In the Claims

Column 12, Line 32, Claim 18 the text "the projected portion of the n al" should be changed to -- the projected portion of the connection terminal --.

Signed and Sealed this  
Sixth Day of July, 2021

Drew Hirshfeld  
*Performing the Functions and Duties of the*  
*Under Secretary of Commerce for Intellectual Property and*  
*Director of the United States Patent and Trademark Office*